OSCILLATOR USING A TRANSISTOR AS VOLTAGE CONTROLLED CAPACITANCE

Filed March 1, 1967

INVENTOR
THOMAS J. CAMPBELL

BY Eugene M. Whitacre

ATTORNEY

INVENTOR
THOMAS J. CAMPBELL

BY Eugene M. Whitacre
ATTORNEY

United States Patent Office 3,422,369

Patented Jan. 14, 1969

3,422,369

OSCILLATOR USING A TRANSISTOR AS VOLTAGE CONTROLLED CAPACITANCE

Thomas J. Campbell, Indianapolis, Ind., assignor to Radio Corporation of America, a corporation of Delaware

Filed Mar. 1, 1967, Ser. No. 619,745

U.S. Cl. 331—36 6 Claims

Int. Cl. H03b 3/04; H03b 3/00

ABSTRACT OF THE DISCLOSURE

The base-to-collector junction of a transistor is used as a voltage variable capacitance device for automatic frequency control of oscillator circuits. The emitter electrode is left unconnected or is connected by a current limiting resistor to the collector electrode to increase the capacitance range of the base-to-collector junction, and to reduce the loading effect of the transistor on the oscillator circuit.

This invention relates to improvements in automatic frequency control circuits, and more particularly to automatic frequency control circuits for the local oscillator of a superheterodyne receiver.

Automatic frequency control (AFC) has been used to control the frequency of oscillator circuits which are subject to frequency drift with changes in voltage, temperature, ageing of components and the like. Usually AFC circuits include means for applying a control voltage which is indicative of the oscillator mistuning to a voltage responsive reactance device incorporated as a portion of the oscillator frequency determining network.

As applied to television receivers, AFC of the local oscillator in the tuner has not met with a great deal of success. One reason for this lack of success is due to the unavailability of a low cost voltage responsive reactance device with a wide enough range of reactance variation. If existing reactance devices are used, such as variable capacitance diodes, the limited capacitance range necessitates close coupling to the active device of the oscillator circuit, which may result in excessive loading and possible cessation of oscillation over some portions of the oscillator frequency range.

An AFC circuit embodying the invention includes a voltage responsive reactance device comprising the collector-base junction of a transistor. The emitter electrode of the transistor is effectively unconnected, or alternatively may be connected to the collector electrode through a suitable current limiting resistor.

The novel features which are considered to be characteristic of this invention are set forth in the appended claims. The invention itself, however, both as to its organization and method of operation, will best be understood when read in connection with the accompanying drawings in which:

Figure 1:
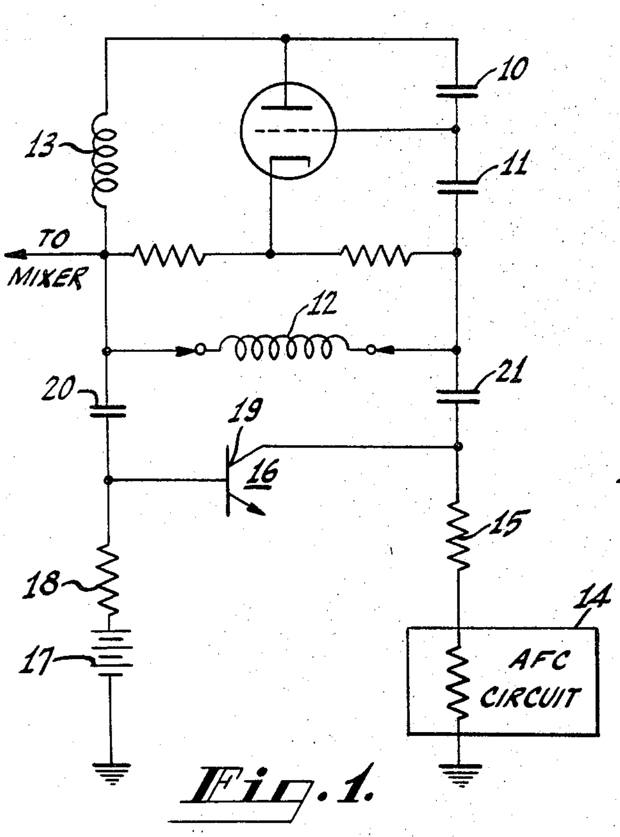
FIGURE 1 is a simplified equivalent alternating current (A-C) circuit diagram of a portion of an oscillator circuit of a television tuner incorporating an AFC circuit embodying the invention.

The oscillator portion of the circuit shown in FIGURE 1, represents the local oscillator of a very high frequency (VHF) television tuner such as a turret tuner. The oscillator frequency is determined by the capacitors 10 and 11, inductors 12 and 13, the interelectrode capacitance of the oscillator tube, stray circuit capacitances, and the capacitance of an AFC circuit coupled across the inductor 12. The generated oscillatory wave is coupled to a mixer circuit, not shown, for heterodyning with a received television signal to produce a difference, or intermediate frequency (I-F) signal. When a different television channel is selected, the oscillator frequency is changed by switching a different inductor in the place of inductor 12, so that the same intermediate frequency is produced.

If the sound and picture carriers of the resultant I-F television signal are not at the proper frequencies, an AFC voltage is developed which indicates the sense and amount of departure of these carriers from the desired frequencies. For example, the picture carrier wave may be applied to a frequency detector, not shown, to develop a suitable AFC voltage. The AFC voltage is used to adjust the oscillator frequency and thereby cause the resultant I-F television signal carriers to return toward the predetermined desired frequencies.

In FIGURE 1 the AFC voltage generating circuit 14 is coupled through a resistor 15 to the collector electrode of a junction transistor 16. A voltage source 17, shown as a battery, but which may take other forms such as a resistor voltage divider, is coupled through a resistor 18 to the base electrode of the transistor 16. The base and collector regions of the transistor 16 define a junction 19 which is coupled through capacitors 20 and 21 across the inductor 12. As the voltage from the AFC source changes, the capacity exhibited by the junction 19 changes to adjust the fine tuning of the oscillator circuit.

Figure 2:
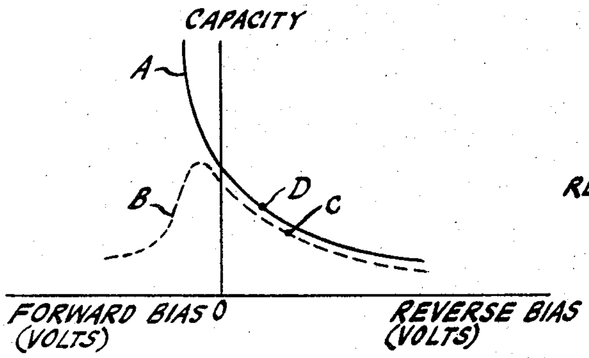
FIGURE 2 is a graph showing two capacitance versus voltage curves.

The nominal AFC voltage from the circuit 14 is equal to the voltage from the voltage source 17 (which may be about 5 volts) and varies over a range of voltage, such as plus and minus 5 volts from the nominal value. For static conditions, the capacity-voltage characteristic of the junction 19 is shown in curve A of FIGURE 2. Curve B of FIGURE 2 shows the same characteristic for a typical varactor (variable reactance) diode. It will be noted that the capacitance decreases as the bias voltage across the junction 19 is increased in the reverse direction. The dotted portion of curve B to the left of the ordinate represents the effect of the increasing conductivity of the diode.

In the circuit of FIGURE 1 the emitter electrode of the transistor 16 is not connected in the circuit. It has been found that by leaving the emitter electrode unconnected, the range of capacitance variation is increased as compared to range of capacitance exhibited by available capacitance diodes. In addition, it was observed that the operation of the oscillator was not deleteriously affected by the loading effects of the AFC circuit, as it is when typical capacitance diodes are used in the circuit.

Attention is now directed to the operation of the AFC circuit described above. When the AFC voltage from the circuit 14 is at its nominal value, i.e. equal to the voltage from the voltage source 17, the net difference in voltage between the base and collector electrodes of the transistor 16 due to the AFC circuit is zero. However, the amplitude of the oscillator voltage is sufficient to forward bias the collector-base junction 19 over at least a portion of the AFC voltage range. This action results in rectification of the oscillator voltage and the charging of capacitors 20 and 21 to a value approaching the peak value of the oscillator voltage. The conduction angle of the rectifying junction is relatively small, being only that amount necessary to replace the charge on the capacitors 20 and 21 which is lost each cycle through the D-C circuit including resistors 15, 18, the voltage supply 17 and the AFC circuit 14. The D-C circuit provides a relatively high resistance so that the discharge time constant of the capacitors 20 and 21 is long relative to a cycle of the oscillating wave.

Figure 4:
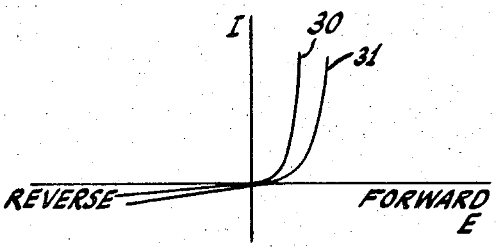
FIGURE 4 is a graph showing two curves representing the current versus voltage characteristic of the collector-base junction of a transistor wherein one curve is with the emitter electrode unconnected, and the other is with the emitter electrode shorted to the base electrode.
Figure 3:
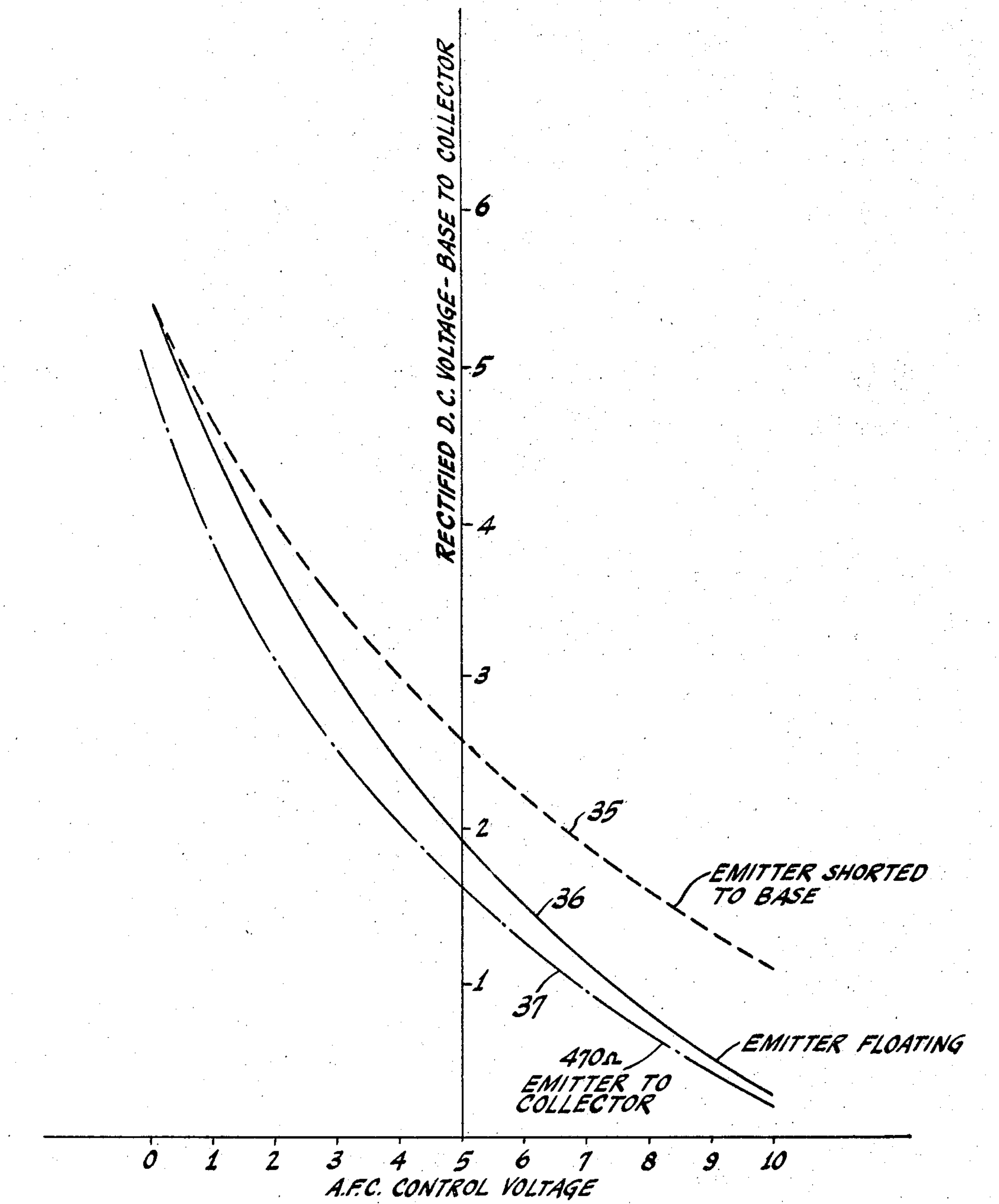
FIGURE 3 is a graph showing the amount of direct voltage produced as a result of oscillator voltage rectification for various connections of a voltage responsive reactance device.

The effect of the AFC voltage on the amount of rectified voltage which is developed is shown in FIGURE 3. As the AFC voltage changes in the forward bias direction, the amount of rectified oscillator voltage is increased. It will be noted that for a given AFC voltage more rectified oscillator voltage is produced when the emitter electrode is shorted to the base electrode (the device approximates a varactor diode) as shown in curve 35, than when the emitter is unconnected as shown in curve 36. The reason for the difference in rectification efficiency may be explained in part by reference to FIGURE 4.

Tests show that with the emitter electrode 21 shorted to the base electrode, the current voltage-characteristic of the junction 19 resembles that of a typical diode. See curve 30 of FIGURE 4. However, when the emitter electrode is floating; i.e. not connected in the circuit, the current voltage characteristic changes to that shown in curve 31 of FIGURE 4, wherein the knee of the collector-to-base diode curve occurs at a greater forward bias voltage. It was found that transistors having a high reverse beta; i.e. the beta measured with the emitter and collector electrodes interchanged, gave the greatest differences in rectified voltage and performed most successfully in circuits embodying the invention.

One important effect of this reduced rectification efficiency indicated by the curve 36 of FIGURE 3 is reduced loading of the oscillator circuit, in that the oscillator does not have to furnish as much power as is necessary with the diode type of reactance device.

The increased range of capacitance for the circuit may be explained wih reference to FIGURE 2. In this figure, the abscissa represents the total voltage across the junction including a component resulting from oscillator rectification, and a component due to the AFC circuit. As mentioned above, curve B represents a typical varactor diode and curve A represents the transistor with the emitter "floating."

Assume that a varactor diode is connected in place of the transistor 16. The same effect may be achieved by connecting the emitter and base electrodes of transistor 16 together. Under a given set of conditions assume that the A-C voltage across the diode due to oscillator rectification and the AFC voltage produce an operating point C. The oscillator voltage causes the instantaneous capacitance to sweep back and forth on curve B on either side of point C. When the oscillator voltage forward biases the diode beyond the knee of curve 30 (FIGURE 4) the diode conducts causing the effective capacitance to drop. The net capacitance presented to the oscillator circuit is the average of the instantaneous capacitances over a cycle of the oscillator voltage.

Under a similar set of operating conditions, but using a transistor connected as shown in FIGURE 1, the operating point for the same AFC voltage will be at point D. The reason for the different operating point is that less rectified voltage is produced with the emitter unconnected as is indicated by the curves of FIGURE 3. The oscillator voltage causes the capacitance to sweep about the operating point D, on curve A, however as shown by curve 31 of FIGURE 4, the junction 19 can be swung further in the forward direction before conduction occurs. In this region of the diode characteristic, the capacitance of the junction is increasing rapidly, and is much larger than the maximum instantaneous capacitance of curve B. Thus, the average of the instantaneous capacitances of the junction 19 over a cycle of oscillator voltage is much greater than where a typical diode is used. The actual value of the effective capacitance is a function of the particular AFC voltage.

Figure 5:
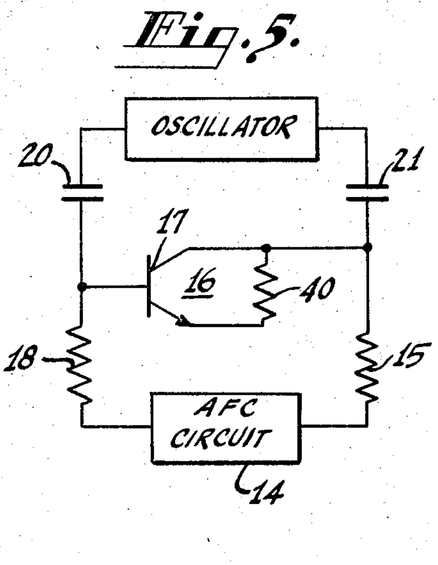
FIGURE 5 is a simplified schematic circuit diagram showing a modification of the AFC transistor connection.

The circuit of FIGURE 5 shows an alternative circuit embodying the invention wherein the emitter electrode is connected to the collector electrode through a current limiting resistor 40. The value of the resistor 40 is selected to prevent the emitter electrode from going into avalanche breakdown when the emitter-base junction is forward biased by the oscillator voltage. A suitable value for this resistor is about 470 ohms when the AFC circuit is used in a very high frequency television tuner.

The circuit of FIGURE 5, like that of FIGURE 1, exhibits the advantages of reduced oscillator loading and increased capacitance range. In the circuits described above, diffused silicon planar transistors were found to provide excellent results. Examples of such transistors are the 2N3641, 2N3642, 2N3643. Further, in order to obtain optimum operation, the transistor collector-to-base junction of the unit employed, should possess an average dynamic capacity which is consistent with the frequency range of interest.

What is claimed is:

1. An electrical circuit comprising:
a transistor having base, collector and emitter regions, said base and collector regions defining a rectifying junction exhibiting a voltage responsive capacitance;
utilization means coupled between said base and collector regions, said utilization means being responsive to the capacitance exhibited by said junction to control an operating characteristic of said utilization means;
means providing a control voltage source;
means coupling said source to said collector and base regions to apply said control voltage across said junction to control the capacitance exhibited by said junction and said operating characteristic of said utilization means; and
a current limiting resistor directly connected between said emitter and collector regions, and providing the sole connection to said emitter region.

2. An electrical circuit comprising:
a transistor having base, collector, and emitter regions, said base and collector regions defining a rectifying junction exhibiting a voltage responsive capacitance;
utilization means coupled between said base and collector regions, said utilization means being responsive to the capacitance exhibited by said junction to control an operating characteristic of said utilization means;
means providing a control voltage source;
means coupling said source to said collector and base regions to apply said control voltage across said junction to control the capacitance exhibited by said junction and said operating characteristic of said utilization means; and
wherein the sole connections to said transistor are to be said collector and base regions.

3. An automatic frequency control circuit comprising:
an oscillation generator for producing an oscillatory wave;
means providing a source of automatic frequency control voltage indicative of the frequency of said oscillation generator;
a transistor having base, emitter and collector regions, said base and collector regions defining a rectifying junction exhibiting a voltage responsive capacitance;
means including a capacitor coupling said base and collector regions to said oscillation generator so that the voltage responsive capacitance exhibited by said rectifying junction is effective to control the frequency of said oscillation generator; and
means connecting said source to said collector and base regions to apply said automatic frequency control voltage across said junction to control the capacitance exhibited by said junction and the frequency of oscillation of said oscillation generator, the oscillatory wave produced by said oscillation generator being of sufficient amplitude to forward bias said rectifying junction, and said source and said means connecting said source to said collector and base regions providing a direct current path between said collector and base regions.

4. An automatic frequency control circuit as defined in claim 3 wherein the time constant of the circuit including said capacitor and said direct current path is long relative to a cycle of said oscillatory wave.

5. An automatic frequency control circuit as defined in claim 3 including a current limiting resistor connected between said emitter and collector regions.

6. An automatic frequency control circuit as defined in claim 3 wherein the sole connections to said transistor are to said collector and base regions.

References Cited

UNITED STATES PATENTS

| | | | |
|---|---|---|---|
| 2,888,648 | 5/1959 | Herring | 331—117 |
| 3,260,960 | 7/1966 | Bangert | 331—177 |

ROY LAKE, *Primary Examiner.*

S. H. GRIMM, *Assistant Examiner.*

U.S. Cl. X.R.

331—167, 177